United States Patent
Nagano et al.

(10) Patent No.: US 9,487,158 B2
(45) Date of Patent: Nov. 8, 2016

(54) CONTROLLER ASSEMBLY AND WORK MACHINE CAB

(71) Applicant: KOMATSU LTD., Tokyo (JP)

(72) Inventors: Masahiro Nagano, Hirakata (JP); Yoshiaki Honma, Hirakata (JP); Daisuke Tsukamoto, Hirakata (JP); Hiroaki Tanaka, Hirakata (JP); Tomoko Kikuma, Hirakata (JP)

(73) Assignee: KOMATSU LTD., Tokyo (JP)

( * ) Notice: Subject to any disclaimer, the term of this patent is extended or adjusted under 35 U.S.C. 154(b) by 0 days.

(21) Appl. No.: 14/419,497

(22) PCT Filed: Oct. 23, 2014

(86) PCT No.: PCT/JP2014/078192
§ 371 (c)(1),
(2) Date: Feb. 4, 2015

(87) PCT Pub. No.: WO2016/063395
PCT Pub. Date: Apr. 28, 2016

(65) Prior Publication Data
US 2016/0114737 A1 Apr. 28, 2016

(51) Int. Cl.
| | |
|---|---|
| *B60R 11/02* | (2006.01) |
| *B60H 1/00* | (2006.01) |
| *E02F 9/16* | (2006.01) |
| *H05K 5/02* | (2006.01) |

(52) U.S. Cl.
CPC ....... *B60R 11/0264* (2013.01); *B60H 1/00378* (2013.01); *E02F 9/16* (2013.01); *H05K 5/0217* (2013.01)

(58) Field of Classification Search
CPC ............... B60H 1/00378; B60H 2001/00228; E02F 9/0858; E02F 9/16; E02F 9/163; E02F 9/2004; B60K 7/0007; B60K 35/00; B60K 37/00; B60K 37/02; B60K 37/04; B60K 37/06; H05K 5/02; H05K 5/0217; B60R 11/0264
USPC .......... 296/190.01, 190.08, 190.09; 180/315, 180/322, 333
See application file for complete search history.

(56) References Cited

U.S. PATENT DOCUMENTS

| | | | | |
|---|---|---|---|---|
| 4,088,364 A | * | 5/1978 | Termont | B62D 33/0617 180/89.12 |
| 4,124,246 A | * | 11/1978 | Brown | B62D 33/0621 180/315 |
| 5,169,097 A | * | 12/1992 | Yasukawa | B60K 37/04 248/27.1 |
| 6,398,294 B1 | * | 6/2002 | Bollweg | B60H 1/00378 296/190.09 |
| 6,412,848 B1 | * | 7/2002 | Ceccanese | B60K 35/00 224/311 |
| 6,715,269 B2 | * | 4/2004 | Nanlawala | A01D 41/12 180/329 |
| 8,684,120 B2 | * | 4/2014 | Suneya | B62D 25/145 180/89.12 |

(Continued)

FOREIGN PATENT DOCUMENTS

| | | |
|---|---|---|
| EP | 2287030 A1 | 2/2011 |
| JP | H05-12795 U | 2/1993 |

(Continued)

*Primary Examiner* — Gregory Blankenship
(74) *Attorney, Agent, or Firm* — Drinker Biddle & Reath LLP

(57) ABSTRACT

A coupling plate is arranged below an attaching member. A vibration suppressing member is mounted between the attaching member and the coupling plate. The first controller main body is arranged above the attaching member. A coupling member connects the coupling plate and the first controller main body.

5 Claims, 9 Drawing Sheets

(56) References Cited

U.S. PATENT DOCUMENTS

| | | | |
|---|---|---|---|
| 2003/0042760 A1* | 3/2003 | Arthur | G05G 9/047 296/190.01 |
| 2006/0243506 A1* | 11/2006 | Dolesh | B65F 3/00 180/89.19 |
| 2010/0102594 A1* | 4/2010 | Kimura | B60H 1/00378 296/190.01 |
| 2012/0218778 A1* | 8/2012 | Hioki | G02B 26/0816 362/613 |
| 2014/0232130 A1 | 8/2014 | Tanaka et al. | |
| 2015/0130219 A1* | 5/2015 | Uchida | E02F 9/16 296/190.01 |
| 2016/0009321 A1* | 1/2016 | Burgess | B62D 25/06 296/190.08 |

FOREIGN PATENT DOCUMENTS

| | | |
|---|---|---|
| JP | H07-326875 A | 12/1995 |
| JP | 2004-278995 A | 10/2004 |
| JP | 2005-146741 A | 6/2005 |
| JP | 2008-152895 A | 7/2008 |
| JP | 2010-133184 A | 6/2010 |
| JP | 2011-202357 A | 10/2011 |
| JP | 5538575 B1 | 7/2014 |

* cited by examiner

CONTROLLER ASSEMBLY AND WORK MACHINE CAB

TECHNICAL FIELD

The present invention relates to a controller assembly and a work machine cab.

BACKGROUND ART

In recent years, a large number of machine controllers are mounted on a work machine along with advancement in functions.

Configurations and arrangements of such machine controllers are disclosed for example in Japanese Patent No. 5538575. In this publication, a placement plate is arranged on a bottom face of a bracket having a U-shape in a side view through a vibration suppressing member, and the machine controllers are arranged on the placement plate. Since the vibration suppressing member provided between the bracket and the placement plate attenuates vibrations, the controllers arranged on the placement plate are protected against acceleration of a vehicle.

CITATION LIST

Patent Document

PTD 1: Japanese Patent No. 5538575

SUMMARY OF INVENTION

Technical Problem

In the publication described above, the machine controllers are arranged behind an operator's seat. At this position, a plurality of controllers are centrally arranged, and the number of controllers is increased as compared to the conventional number along with advancement in functions of hydraulic excavator. Therefore, there has been a problem that a space for arranging the controllers is decreased and it would be difficult to assemble or repair equipment.

The present invention was made in view of the problem described above, and its object is to provide a controller assembly and a work machine cab facilitating assembling or repairing of equipment.

Solution to Problem

A controller assembly of the present invention comprises an attaching member, a coupling plate, a vibration suppressing member, a first controller main body, and a coupling member. The coupling plate is arranged below the attaching member. The vibration suppressing member is mounted between the attaching member and the coupling plate. The first controller main body is arranged above the attaching member. The coupling member connects the coupling plate and the first controller main body.

According to the controller assembly of the present invention, the coupling plate is attached to a lower side of the attaching member through the vibration suppressing member, and the first controller main body on an upper side of the attaching member is attached to the coupling plate through the coupling member. Therefore, by fixing the attaching member to other member, even when vibrations are applied to the attaching member from other member, the vibration suppressing member can attenuate the vibrations, so that vibrations transmitted to the first controller main body can be reduced.

Since the attaching member is attached to other member as described above, it would be necessary to allow the attaching member to extend to the location where other member is fixed. Therefore, a size of the attaching member is increased by the length of extension. On the other hand, the coupling plate is all necessary to be coupled to the attaching member through the vibration suppressing member and connected to the first controller main body through the coupling member. Therefore, not so large size is required for the coupling plate. Accordingly, the size of the coupling plate can be set smaller than the size of the attaching member.

Since this small-sized coupling plate is arranged below the large-sized attaching member, members located below the controller assembly is less likely to interfere with the coupling plate. Therefore, it facilitates effective use of the space under the controller assembly, so that equipment can be readily assembled or repaired.

In the controller assembly described above, the first controller main body has a main body part having a first side face and a second side face opposite to each other, and a connector provided at the first side face of the main body part. In a plan view, a size of the coupling plate is smaller than a size of the attaching member, in a direction from the first side face toward the second side face.

As described above, the coupling plate having a size smaller than the attaching member is arranged below the attaching member. Therefore, the coupling plate becomes less likely to interfere with members arranged below the controller assembly. Accordingly, effective use of the space under the controller assembly is facilitated, so that equipment can be readily assembled or repaired.

In the controller assembly described above, a size of the coupling plate in a direction from the first side face toward the second side face is smaller than a size of the main body part of the first controller main body.

Since the coupling plate is all necessary to be joined to the attaching member through the vibration suppressing member and connected to the first controller main body through the coupling member, the size can be set smaller than the first controller main body in a plan view. Accordingly, the space below the controller assembly can be utilized more effectively, so that equipment can be readily assembled or repaired.

A work machine cab of the present invention comprises the controller assembly according to any one of those described above, and a base plate supporting the attaching member of the controller assembly.

According to the work machine cab of the present invention, the attaching member is supported by the base plate, so that the controller assembly can be supported by the base plate.

In the work machine cab described above, a through hole is formed in the base plate. The attaching member has a support member supported on a top face of the base plate, a hanging part extending from the support member through the through hole of the base plate to a lower side of the base plate, and a bottom face part connected to a lower end of the hanging part. The first controller main body is arranged above the bottom face part.

By arranging the attaching member through the through hole of the base plate as described above, the controller assembly can be arranged below the top face of the base plate.

The work machine cab described above further comprises a second controller main body, an air conditioning unit, a duct, and a fuse box. The second controller main body is arranged next to the first controller main body. The duct is connected to the air conditioning unit and has a portion arranged below the controller assembly. In a plan view, the duct is arranged so as to overlap with the controller assembly. The fuse box is arranged above and behind the second controller main body.

By arranging the first controller main body and the second controller main body laterally next to each other, a large space can be secured above the second controller main body. Therefore, the fuse box can be readily arranged in the space above and behind the second controller main body.

More over, as described above, the small-sized coupling plate is arranged below the attaching member in the controller assembly of the present invention. Therefore, when the controller assembly is assembled, the controller assembly is less likely to interfere with the duct arranged below the controller assembly, so that equipment can be readily assembled or repaired.

Advantageous Effects of Invention

As described above, according to the present invention, a controller assembly and a work machine cab can be achieved which facilitates assembling or repairing of equipment.

DESCRIPTION OF EMBODIMENT

In the following, an embodiment of the present invention will be described with reference to the drawings.

Firstly, a configuration of a work machine according to one embodiment of the present invention will be described. In the following, a hydraulic excavator as one example of a work machine to which the idea of the present invention is applicable and a cab used for the hydraulic excavator will be described with reference to FIGS. 1 and 2. It should be noted that the present invention is applicable to a hydraulic excavator and also to work machines such as a crawler dozer, a wheel loader, and the like having a cab.

Figure 1:
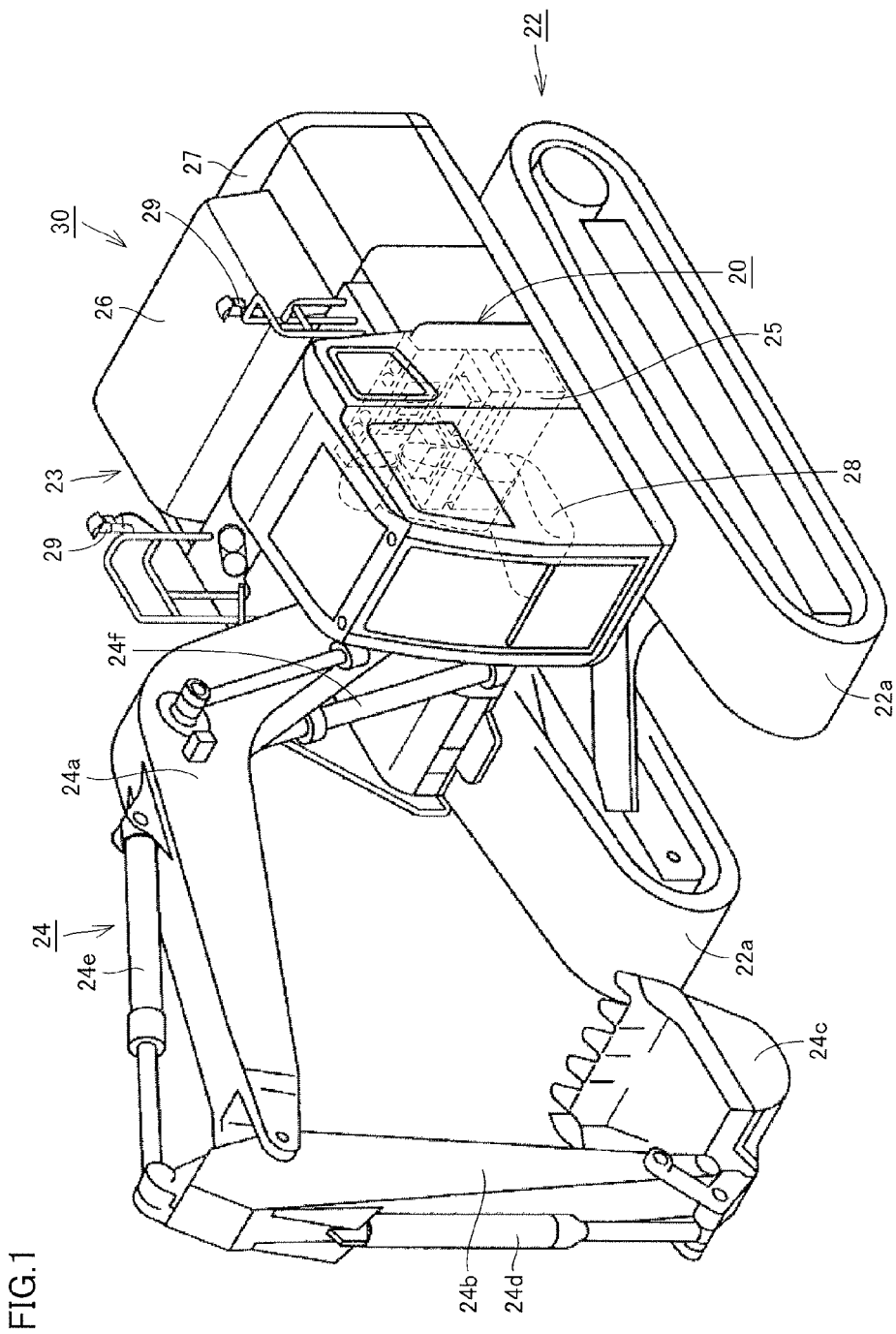
FIG. 1 is a perspective view schematically representing a configuration of a hydraulic excavator according to one embodiment of the present invention.
Figure 2:
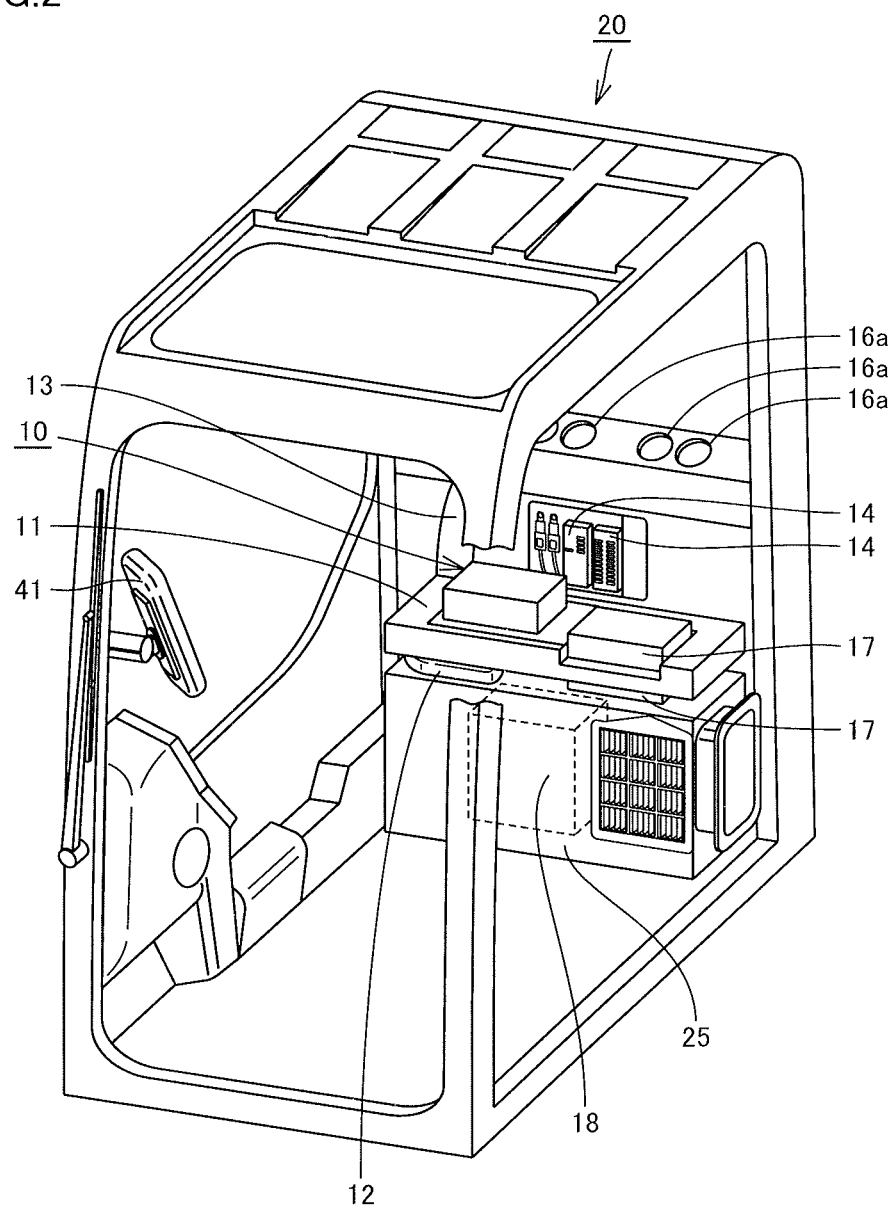
FIG. 2 is a partial perspective view representing a cab of the hydraulic excavator of FIG. 1.

FIG. 1 is a perspective view schematically representing a configuration of the hydraulic excavator according to one embodiment of the present invention. FIG. 2 is a partially enlarged perspective view representing a cab of the hydraulic excavator of FIG. 1.

As shown in FIG. 1, a hydraulic excavator 30 mainly has a base carrier 22, a upper revolving unit 23, and a work implement 24.

Base carrier 22 is configured to be self-propelled with rotation of a pair of left and right crawler belts 22a. Upper revolving unit 23 is revolvably mounted on base carrier 22. Work implement 24 is axially supported on a front side of upper revolving unit 23 in an undulating manner. This work implement 24 has a boom 24a, a dipper stick 24b, a bucket 24c, hydraulic cylinders 24d, 24e, 24f, and the like.

Base carrier 22 and upper revolving unit 23 described above mainly constitute a work vehicle main body. Upper revolving unit 23 has a cab 20 on a front left side of the vehicle main body, and has an engine compartment 26 accommodating an engine and a counter weight 27 on a rear side of the vehicle main body. An antenna 29 is provided on an upper face of upper revolving unit 23.

Cab 20 has an internal space. In the internal space of cab 20, an operator's seat 28 to be seated by an operator is arranged. A back panel 25 is arranged behind operator's seat 28.

As shown in FIG. 2, an air conditioning unit 18 is arranged behind back panel 25. In FIG. 2, only back panel 25 on a lower side is shown, and a part of the back panel on an upper side is omitted from illustration. Accordingly, a controller assembly 10, a base plate 11, ducts 12, 13, fuse boxes 14, a second controller main body 17, and the like appear on FIG. 2 which are covered by the back panel on the upper side and originally cannot be seen.

Each of controller assembly 10 and second controller main body 17 is supported on base plate 11. Second controller main body 17 is arranged next to controller assembly 10, and controller assembly 10 and second controller main body 17 are arranged laterally next to each other.

Each of ducts 12, 13 is connected to air conditioning unit 18. Below controller assembly 10, a part of each duct 12, 13 is located. Duct 12 is configured to lead air transferred from air conditioning unit 18 to a lower part region in an internal space of cab 20. Duct 13 is configured to lead air transferred from air conditioning unit 18 to air outlets 16a.

Fuse boxes 14 have a plurality of fuses. These fuse boxes 14 are arranged above and behind second controller main body 17. An ICT monitor 41 is arranged in the internal space of cab 20. This ICT monitor 41 is supported on a pillar provided for example on a front right side.

In the present embodiment, the front/rear and left/right sides of the vehicle are defined based on an operator to be seated on operator's seat 28 of cab 20 as a reference. The forward and rearward directions represent the forward and rearward directions of an operator seated on operator's seat 28. The leftward and rightward directions represent the leftward and rightward directions of an operator seated on operator's seat 28. The upward and downward directions represent the upward and downward directions of an operator seated on operator's seat 28. The direction confronting an operator seated on operator's seat 28 is the frontward direction, and the direction opposite to the frontward direction is the rearward direction. The right side and left side in the sideward directions in the state where an operator seated on operator's seat 28 confronts the front are the rightward direction and leftward direction, respectively. The side on feet of an operator seated on operator's seat 28 is the lower side and the side on a head is the upper side.

Next, a configuration of each constituting member of the controller assembly according to one embodiment of the present invention will be described with reference to FIG. 3.

Figure 3:
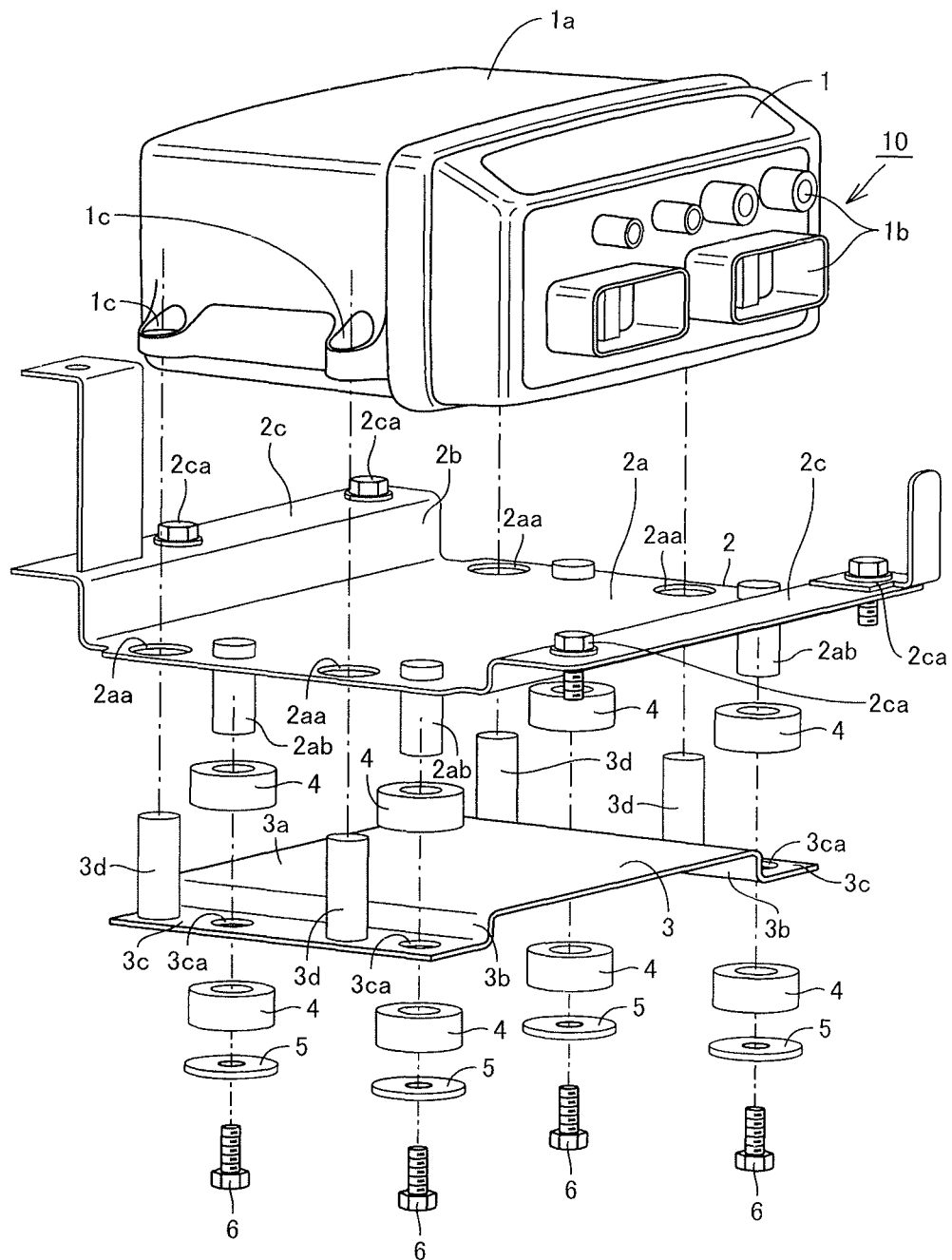
FIG. 3 is an exploded perspective view representing a configuration of a controller assembly according to one embodiment of the present invention.

FIG. 3 is an exploded perspective view representing a configuration of the controller assembly according to one embodiment of the present invention. As shown in FIG. 3, controller assembly 10 mainly has a first controller main body 1, an attaching member 2, a coupling plate 3, vibration suppressing members 4, and coupling members 3d.

First controller main body 1 is configured to process positional information of a work machine and a work equipment in, for example, an information-oriented construction system. First controller main body 1 has a main body part 1a, a plurality of connectors 1b, and projecting fixing parts 1c. Main body part 1a has a shape of an approximately rectangular parallelepiped, and has a processing device such as an MPU (Micro Processing Unit). The plurality of connectors 1b are portions for connection with a cable or the like. The plurality of connectors 1b are provided centrally on one side face of main body part 1a. Projecting fixing parts 1c project sideward from side faces of main body part 1a. Projecting fixing parts 1c are provided on side faces which are different from the side face on which the plurality of connector 1b are provided.

Attaching member 2 has a bottom face part 2a, hanging parts 2b, and support members 2c. Bottom face part 2a, hanging parts 2b, and support members 2c are integrally formed from one plate member. Bottom face part 2a is made of a flat plate. A plurality of through holes 2aa are formed in bottom face part 2a. Moreover, bottom face part 2a is provided with boss parts 2ab projecting downward from bottom face part 2a. For example, a female threaded part is formed on this boss part 2ab.

Hanging parts 2b are connected to each of two opposite sides of bottom face part 2a and extend upward from the connection parts. Support members 2c are connected to upper ends of hanging parts 2b and bent sideward against hanging parts 2b. Fixing parts 2ca are provided at support members 2c. These fixing parts 2ca are portions configured to fix attaching member 2 to base plate 11 (FIG. 2), and are bolts for example. Fixing parts 2ca are not limited to the bolts and may be pins or welding as long as they are portions which can fix support members 2c to base plate 11.

Coupling plate 3 has a flat plate part 3a, step parts 3b, and flange parts 3c. Flat plate part 3a, step parts 3b, and flange parts 3c are integrally formed from one sheet of a plate member. Flat plate part 3a is made of a flat plate. Flange parts 3c are connected to flat plate part 3a through step parts 3b. Through holes 3ca are formed in flange parts 3c.

At top faces of flange parts 3c (the faces on a side of first controller main body 1), coupling members 3d are attached. Coupling member 3d is made of, for example, a cylindrical rigid body, and has a female threaded part formed at its tip.

Vibration suppressing members 4 attenuate vibrations applied to hydraulic excavator 30 and cab 20 and prevent magnification of vibrations to thereby reduce vibration of first controller main body 1. Vibration suppressing members 4 are arranged between attaching member 2 and the coupling plate, and are made of an elastic body such as rubber. Vibration suppressing member 4 has a circular ring shape or a cylindrical shape and has a through hole in an axial direction.

Next, assembling of the controller assembly according to one embodiment of the present invention will be described with reference to FIGS. 3 and 4.

Figure 4:
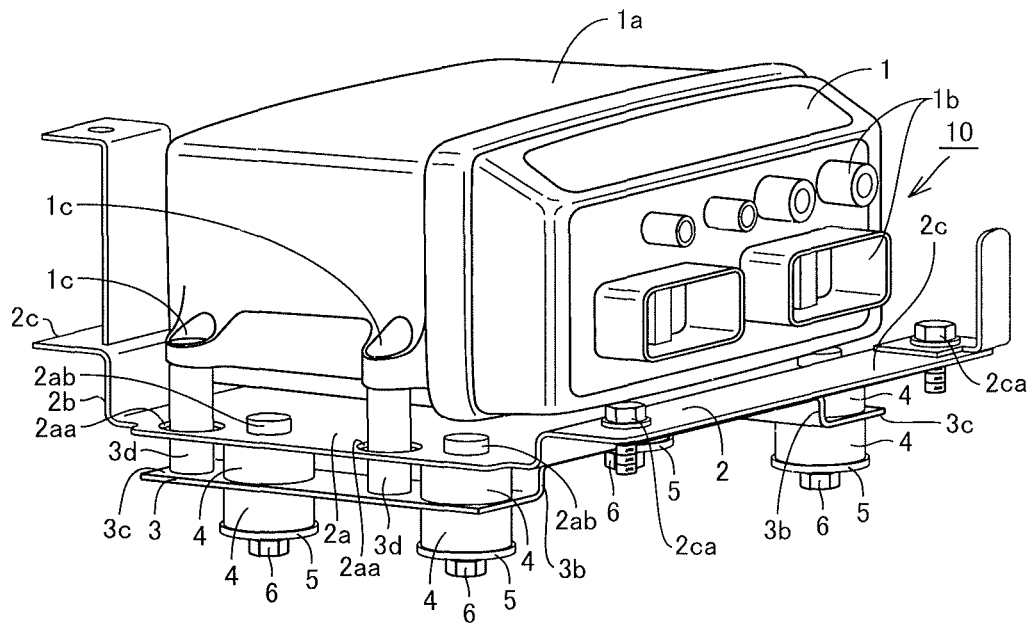
FIG. 4 is an assembled perspective view representing a configuration of the controller assembly according to one embodiment of the present invention.

FIG. 4 is an assembled perspective view representing a configuration of the controller assembly according to one embodiment of the present invention. As shown in FIGS. 3 and 4, vibration suppressing members 4 are fitted to boss parts 2ab of attaching member 2. Coupling plate 3 is attached to a lower side of attaching member 2 through vibration suppressing members 4. In this state, vibration suppressing members 4 are mounted between attaching member 2 and coupling plate 3.

Coupling plate 3 is retained while hanging from attaching member 2 by screwing bolts 6 to female threaded parts of boss parts 2ab. Boss parts 2ab of attaching member 2 pass across through holes 3ca of flange parts 3c from above coupling plate 3 through vibration suppressing members 4, and are fitted into through holes of another vibration suppressing members 4. Bolts 6 are screwed to female threaded parts of boss parts 2ab through washers 5.

In the state where coupling plate 3 is retained at attaching member 2 while preventing vibrations, coupling members 3d pass across through holes 2aa of attaching member 2 and project upward from a lower part of attaching member 2. A diameter of through hole 2aa is set to be larger than an outer diameter of coupling member 3d. Accordingly, coupling member 3d passes across through hole 2aa so as not to come in contact with a circumference of through hole 2aa.

First controller main body 1 is fixed to coupling plate 3 through coupling members 3d. Specifically, projecting fixing parts 1c of first controller main body 1 and coupling members 3d are fixed to each other by allowing bolts (not illustrated in the drawings) to pass through the through holes of projecting fixing parts 1c and screwing them to the female threaded parts of coupling members 3d. In the state where first controller main body 1 is fixed to coupling plate 3, first controller main body 1 is not in contact with attaching member 2 and is spaced apart from each other.

In the manner as described above, controller assembly 10 is assembled. Controller assembly 10 assembled in this manner is attached to cab 20 by fixing support members 2c to base plate 11 (FIG. 2) with fixing parts 2ca.

Next, a configuration of a state in which controller assembly 10 according to one embodiment of the present invention is assembled will be described with reference to FIGS. 4 to 6.

Figure 5:
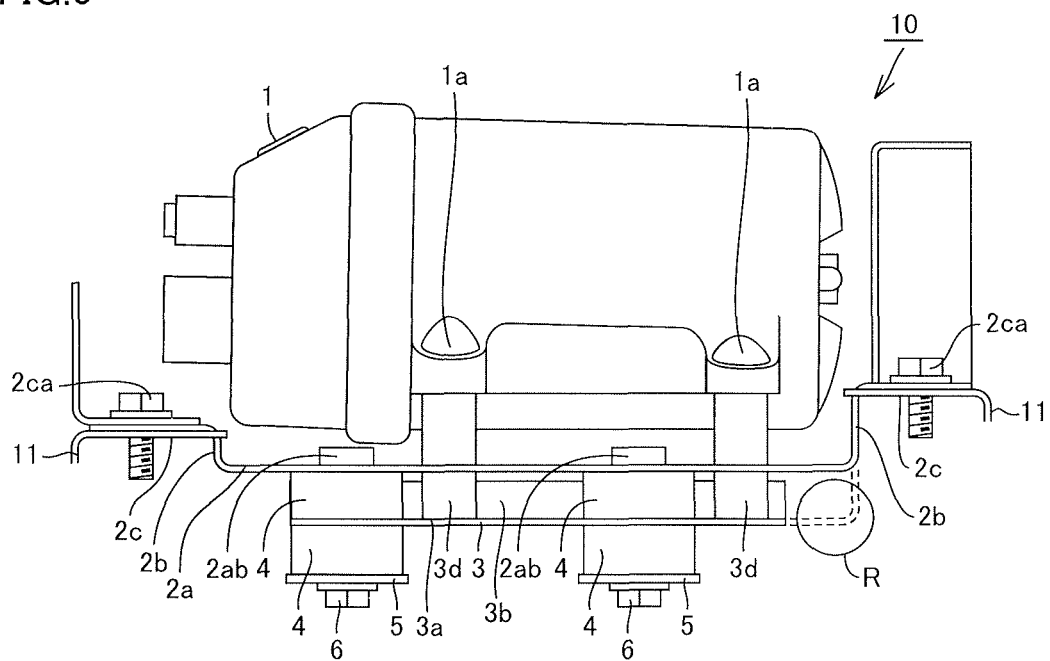
FIG. 5 is a side view representing a configuration of the controller assembly according to one embodiment of the present invention.

FIG. 5 is a side view representing a configuration of the controller assembly according to one embodiment of the present invention. FIG. 6 is a plan view representing a configuration of the controller assembly according to one embodiment of the present invention. As shown in FIGS. 4 and 5, coupling plate 3 is arranged below attaching member 2. Vibration suppressing members 4 are mounted between attaching member 2 and coupling plate 3. The top faces of vibration suppressing member 4 come in contact with the lower face of attaching member 2, and the lower faces of vibration suppressing members 4 come in contact with the top face of coupling plate 3. It is not always necessary that vibration suppressing members 4 are directly in contact with each of attaching member 2 and coupling plate 3, and it is all necessary to be mounted between attaching member 2 and coupling plate 3.

Moreover, other than vibration suppressing members 4 mounted between attaching member 2 and coupling plate 3, another vibration suppressing members 4 are mounted below coupling plate 3. The top faces of another vibration suppressing members 4 come in contact with the lower surface of coupling plate 3, and the lower faces of another vibration suppressing members 4 come in contact with top faces of washers 5. It is also not always necessary that another vibration suppressing members 4 directly come in contact with coupling plate 3 and each of washers 5, and it is all necessary to be mounted between coupling plate 3 and washers 5.

First controller main body 1 is arranged above attaching member 2. Coupling plate 3 and first controller main body 1 are connected by coupling members 3d. The lower faces of coupling members 3d come in contact with the top face of coupling plate 3, and the top faces of coupling members 3d come in contact with the lower faces of projecting fixing parts 1c of first controller main body 1.

First controller main body 1 and attaching member 2 are spaced apart from each other with a space therebetween, and are not in direct contact with each other. Attaching member 2 and coupling plate 3 are spaced apart from each other with a space therebetween, and are not in direct contact with each other.

Figure 6:
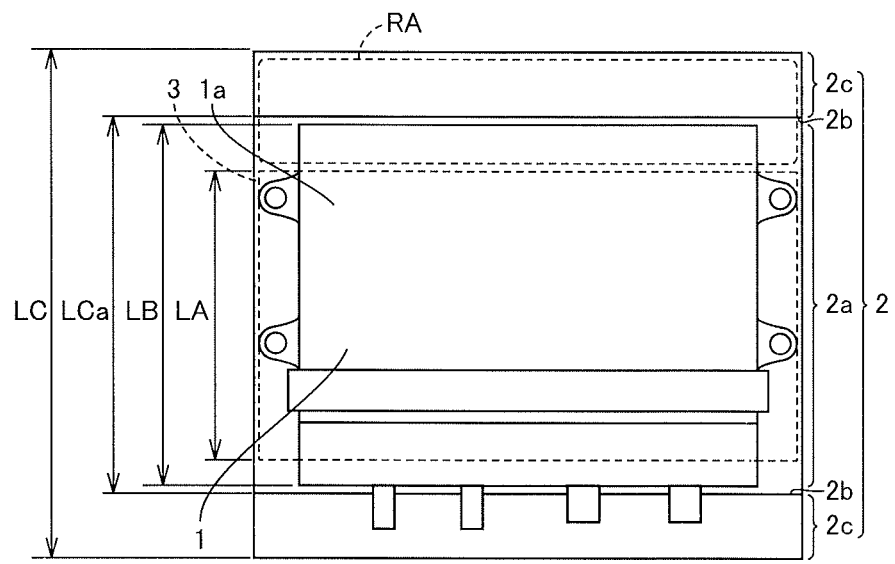
FIG. 6 is a plan view representing a configuration of the controller assembly according to one embodiment of the present invention.

As shown in FIG. 6, in a plan view, a size LA of coupling plate 3 in a short direction is smaller than a size LC of attaching member 2 in a short direction. Size LA of coupling plate 3 in the short direction is smaller than a size LB of main body part 1a of first controller main body 1 in a short direction. Size LC of attaching member 2 in the short direction is larger than size LB of main body part 1a of first controller main body 1 in the short direction.

Moreover, in a plan view, a size LCa of bottom face part 2a of attaching member 2 in the short direction is larger than size LB of main body part 1a of first controller main body 1 in the short direction. Therefore, in a plan view, main body part 1a of first controller main body 1 entirely overlaps with bottom face part 2a of attaching member 2.

Moreover, the short direction of each of main body part 1a, attaching member 2, and coupling plate 3 in the description above is a direction from a first side face of main body part 1a at which connectors 1b are provided to a direction toward a second face opposite to the first side face. Moreover, the short direction is a direction in which bottom face part 2a, hanging parts 2b, and support members 2c of attaching member 2 are aligned.

Next, attaching of controller assembly 10 to cab 20 and a resulting configuration after attaching according to one embodiment of the present invention will be described with reference to FIGS. 7 to 10.

Figure 7:
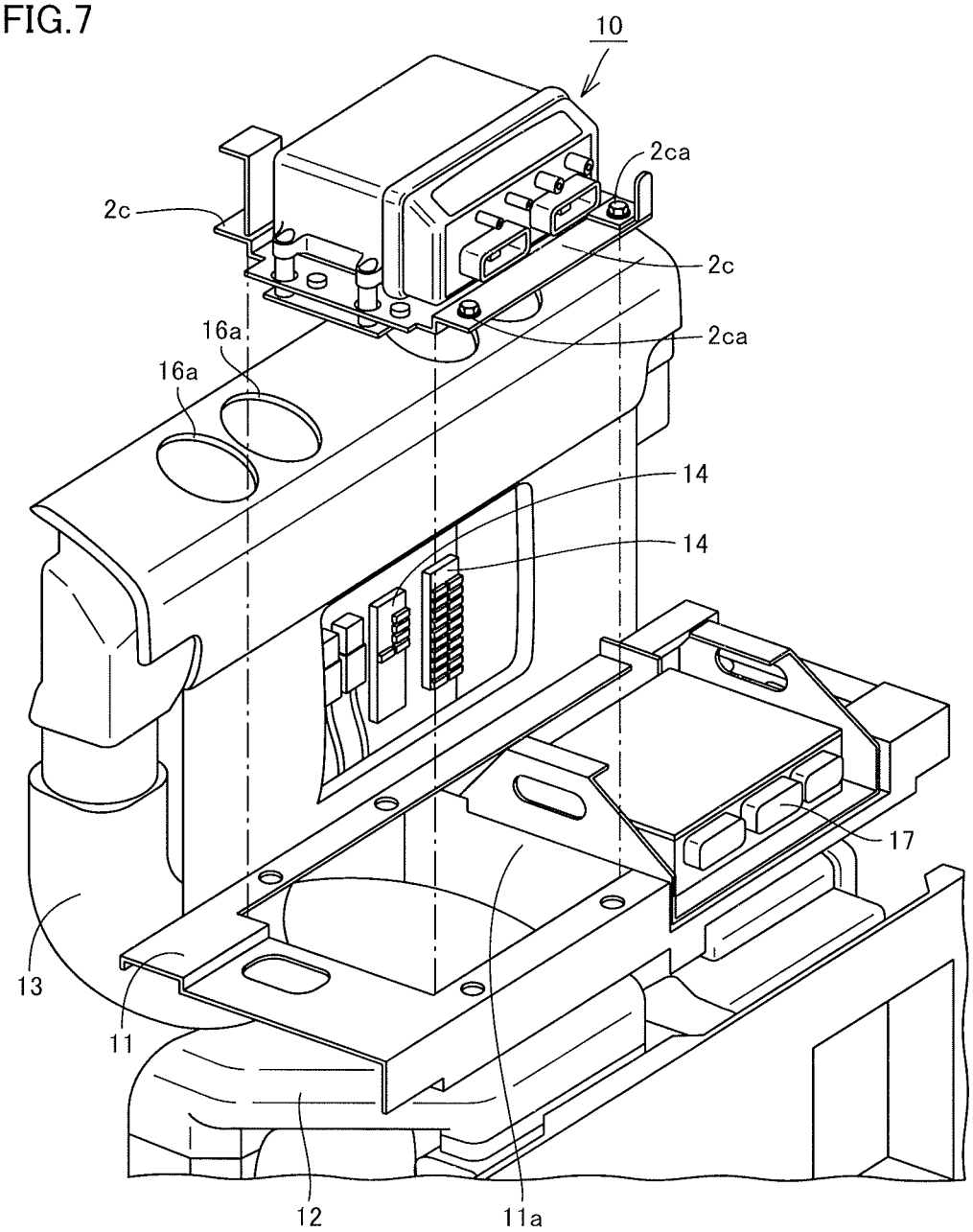
FIG. 7 is a perspective view representing a state before the controller assembly according to one embodiment of the present invention is assembled in the work machine cab.
Figure 8:
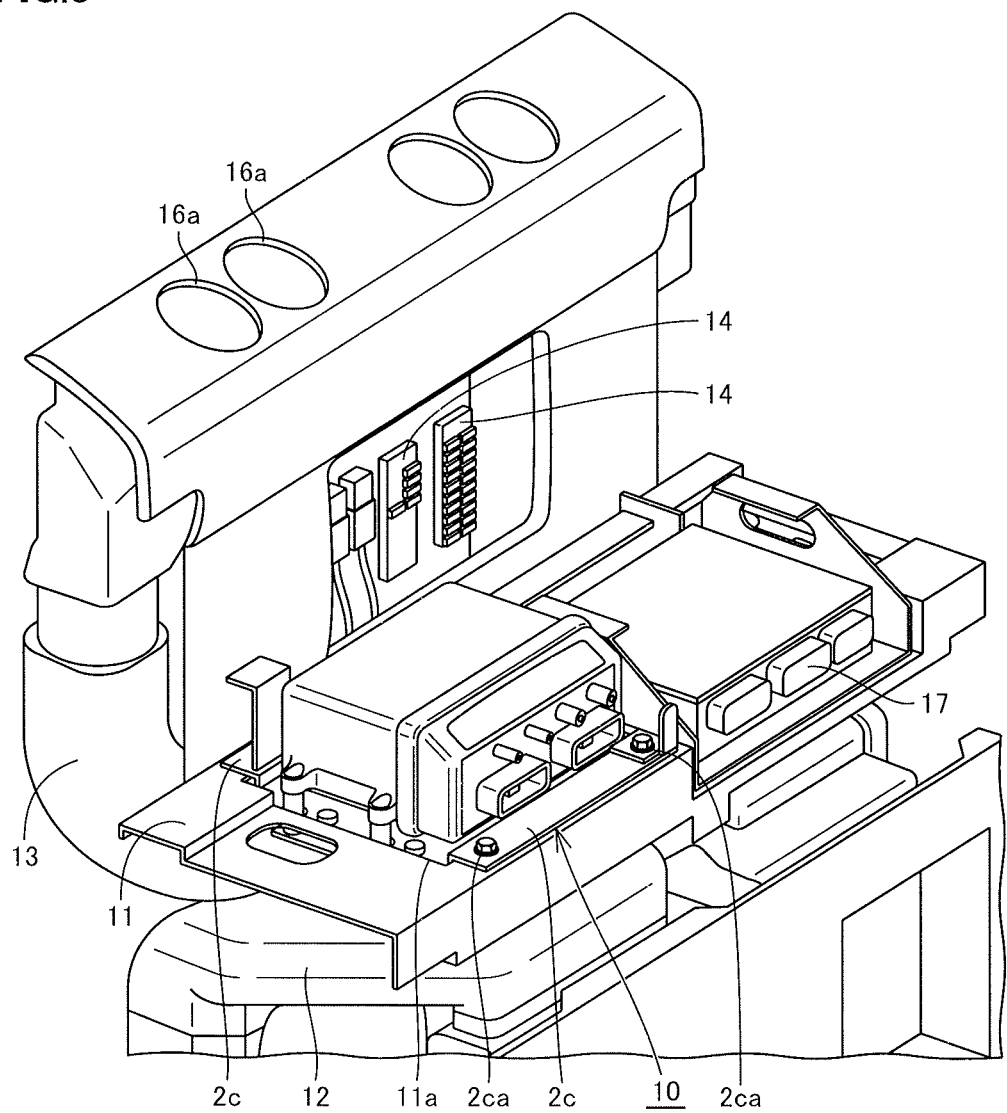
FIG. 8 is a perspective view representing a state after the controller assembly according to one embodiment of the present invention is assembled in the work machine cab.
Figure 9:
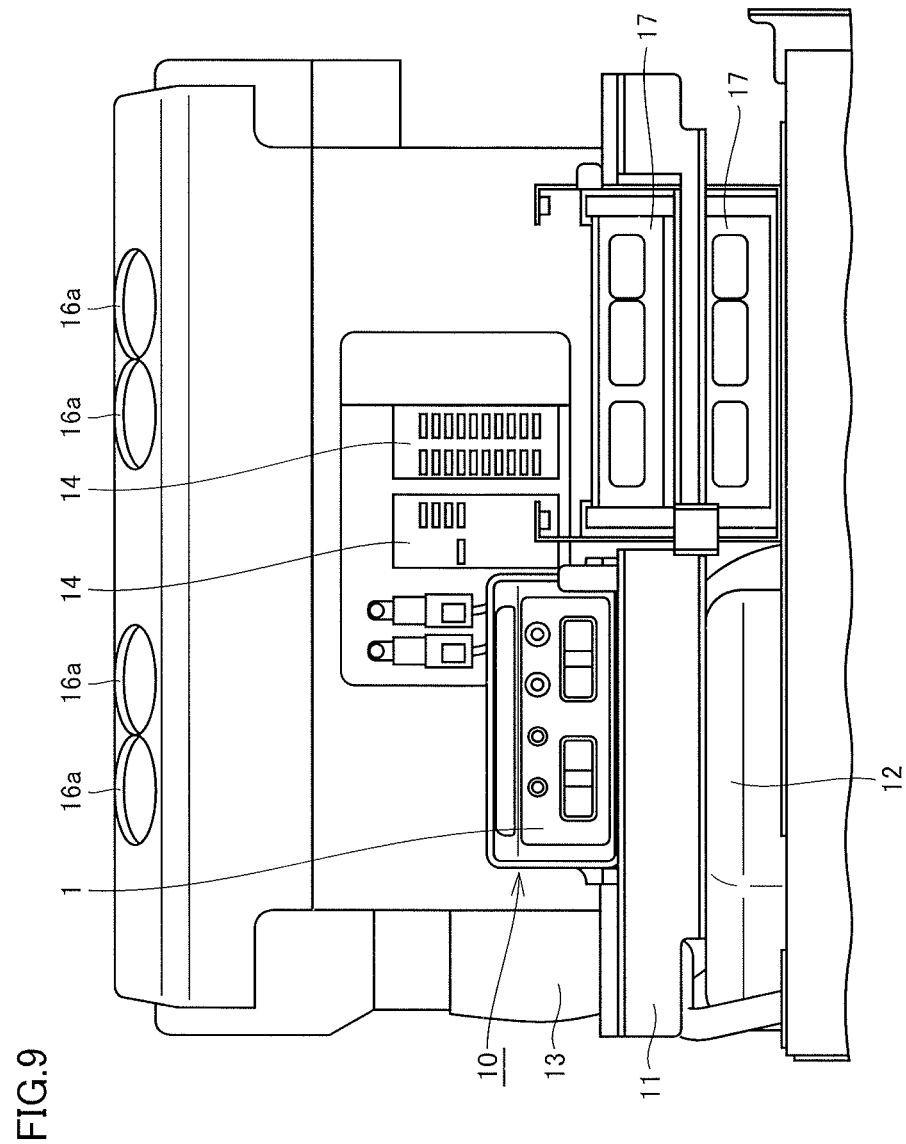
FIG. 9 is a front view representing a state in which the controller assembly according to one embodiment of the present invention is assembled in the work machine cab.
Figure 10:
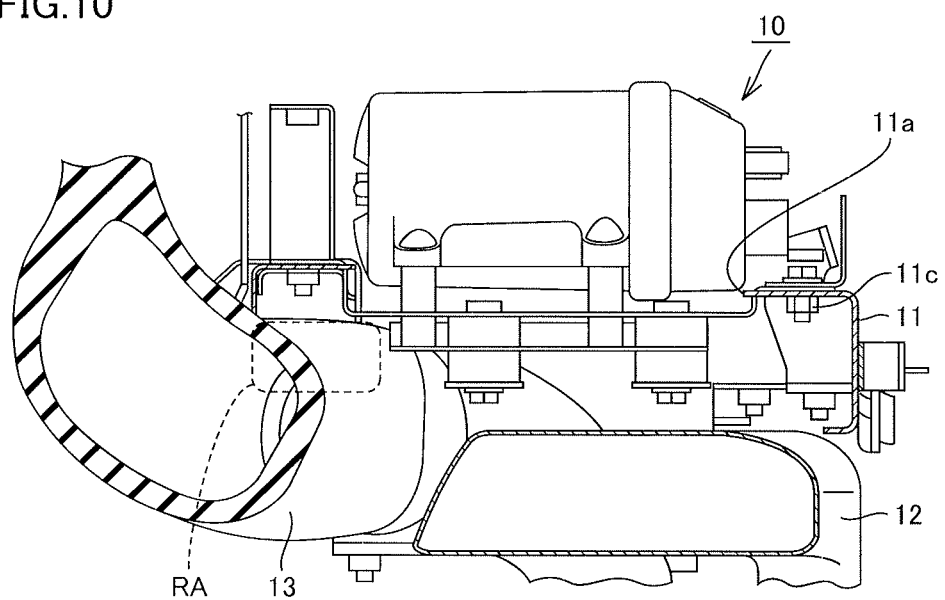
FIG. 10 is a partially broken side view representing a positional relationship between the controller assembly and the duct in a state where the controller assembly according to one embodiment of the present invention is assembled in the work machine cab.

FIGS. 7 and 8 are perspective view representing states before and after assembling the controller assembly in the cab according to one embodiment of the present invention. FIG. 9 is a front view representing a state where the controller assembly according to one embodiment of the present invention is assembled in the cab. FIG. 10 is a partially broken side view representing the controller assembly and the duct in the state where the controller assembly according to one embodiment of the present invention is assembled in the cab.

As shown in FIGS. 7 and 8, controller assembly 10 is supported on base plate 11 of cab 20. A through hole 11a is formed in base plate 11, and controller assembly 10 is attached to base plate 11 so as to fit into this through hole 11a.

When controller assembly 10 is attached to base plate 11, support members 2c of attaching member 2 are supported on a top face of base plate 11. Support members 2c and base plate 11 are fastened with bolts 2ca and nuts 11c (FIG. 10).

As shown in FIG. 9, in a state where controller assembly 10 is attached to base plate 11, second controller main body 17 is arranged next to first controller main body 1, and first controller main body 1 and second controller main body 17 are arranged laterally next to each other. Two second controller main bodies 17 are arranged in a longitudinal direction. Fuse boxes 14 are arranged above and behind second controller main body 17.

As shown in FIG. 5, in the state where controller assembly 10 is attached to base plate 11, support members 2c of attaching member 2 are supported on the top face of base plate 11. Hanging parts 2b of attaching member 2 extend from its support members 2c across through holes 11a of base plate 11 to a lower side of base plate 11. Bottom face part 2a of attaching member 2 is connected to lower ends of hanging parts 2b. Main body part 1a of first controller main body 11 is arranged above bottom face part 2a.

As shown in FIG. 10, a part of a duct 12 and a part of a duct 13 are arranged in a region just under controller assembly 10. In a plan view, the part of each of ducts 12, 13 is arranged so as to overlap with controller assembly 10. Particularly, the part of duct 13 is arranged in a region RA on a rear side within the region just under controller assembly 10 (FIGS. 6 and 10).

Next, the effects of the present embodiment will be described with comparison to a comparative example in which the attaching member is located below the coupling plate.

According to controller assembly 10 of the present embodiment, coupling plate 3 is attached to attaching member 2 through vibration suppressing members 4, and first controller main body 1 is attached to coupling plate 3 through coupling members 3d, as shown in FIG. 4. Therefore, as shown in FIG. 8, by fixing attaching member 2 to base plate 11, even when vibrations are applied from base plate 11 to attaching member 2, the vibrations can be attenuated by vibration suppressing, members 4, so that vibrations transmitted to first controller main body 1 can be reduced.

Moreover, attaching member 2 is a member fixed to base plate 11. Therefore, it would be necessary to allow attaching member 2 to extend to the location of fixing to base plate 11, so that a size of attaching member 2 becomes larger by the length of extension. On the other hand, coupling plate 3 is all necessary to be coupled to attaching member 2 through vibration suppressing members 4 and connected to first controller main body 1 through coupling members 3d. Therefore, a large size is not required for coupling plate 3. Accordingly, the size of coupling plate 3 can be set smaller than the size of attaching member 2.

If large-sized attaching member 2 is located below small-sized coupling plate 3, attaching member 2 is located in a region R indicated by the broken lines in FIG. 5, so that interference with members arranged below controller assembly 10 is likely to occur (for example, duct 13 in FIG. 10).

On the other hand, according to the present embodiment, as shown in FIG. 5, small-sized coupling plate 3 is arranged below attaching member 2. Therefore, attaching member 2 is not located in region R shown in FIG. 5. Accordingly, attaching member 2 and coupling plate 3 do not interfere with other members in region R. Accordingly, coupling plate 3 is less likely to interfere with members arranged below controller assembly 10 (for example, duct 13 in FIG. 10). Therefore, effective use of the space below controller assembly 10 can be facilitated, so that assembling or repairing of equipment can be readily performed.

Moreover, since vibration suppressing members 4 arranged on a lower side of attaching member 2 suppresses vibrations of first controller main body 1 arranged on an upper side of attaching member 2, a position of first controller main body 1 with a position of attaching member 2 as a reference height can be set lower than a conventional configuration. Therefore, a larger space can be obtained above first controller main body 1.

Moreover, as shown in FIG. 6, size LA of coupling plate 3 in the short direction is smaller than size LC of attaching member 2 in the short direction in a plan view. As shown in FIG. 5, coupling plate 3 having a size smaller than that of this attaching member 2 is arranged below attaching member 2. Therefore, interference with duct 13 (FIG. 10) is less likely to occur in region R below controller assembly 10. Therefore, effective use of the space below controller assembly 10 can be facilitated, so that assembling or repairing of equipment can be readily performed.

Moreover, as described above, coupling plate 3 is all necessary to be joined to attaching member 2 through vibration suppressing members 4 and connected to first controller main body 1 through coupling members 3d. Therefore, as shown in FIG. 6, size LA of coupling plate 3 in the short direction can be set smaller than size LB of main body part 1a of first controller main body 1 in the short direction in a plan view. Accordingly, the space below controller assembly 10 can be used effectively, so that assembling or repairing of equipment can be performed more readily.

Moreover, as shown in FIGS. 7 and 8, attaching member 2 is supported on base plate 11, so that controller assembly 10 can be supported on base plate 11.

Moreover, as shown in FIGS. 7 and 10, controller assembly 10 can be arranged below the top face of base plate 11 by arranging attaching member 2 across through hole 11a of base plate 11.

Moreover, as shown in FIGS. 8 and 9, first controller main body 1 and second controller main body 17 are arranged laterally next to each other, so that a large space can be secured above second controller main body 17. Therefore, fuse boxes 14 can be readily arranged in a space above and behind second controller main body 17.

In the embodiment described above, it has been described that first controller main body 1 is an information-oriented construction machine controller. However, it may be a controller other than that.

It should be understood that the embodiment disclosed herein is illustrative and non-restrictive in every respect. The scope of the present invention is defined by the terms of claims, rather than the description of the embodiments set forth above, and is intended to include any modifications within the scope and meaning equivalent to the terms of the claims.

REFERENCE SIGNS LIST 1 first controller main body; 1a main body part; 1b connector; 1c projecting fixing part; 2 attaching member; 2a bottom face part; 2aa, 3ca, 11a through hole; 2ab boss part; 2b hanging part; 2c support member; 2ca, 6 bolt; 3 coupling plate; 3a flat plate part; 3b step part; 3c flange part; 3d coupling member; 4 member; 5 washer; 10 controller assembly; 10 controller assembly; 11 base plate; 11c nut; 12, 13 duct; 14 fuse box; 16a air outlet; 17 second controller main body; 18 air conditioning unit; 20 cab; 22 base carrier; 22a crawler belt; 23 upper revolving unit; 24 work implement; 24a boom; 24b dipper stick; 24c bucket; 24d bucket hydraulic cylinder; 24e dipper stick hydraulic cylinder; 24f boom hydraulic cylinder; 25 back panel; 26 engine compartment; 27 counter weight; 28 operator's seat; 29 antenna; 30 hydraulic excavator; 41 monitor.

The invention claimed is:

1. A controller assembly, comprising:
    an attaching member;
    a coupling plate arranged below said attaching member;
    a vibration suppressing member mounted between said attaching member and said coupling plate;
    a first controller main body arranged above said attaching member; and
    a coupling member coupling said coupling plate and said first controller main body, wherein
    said first controller main body has a main body part having a first side face and a second side face opposite to each other, and a connector provided at the first side face of the main body part, and
    in a plain view, a size of said coupling plate in a direction from said first side face toward said second side face is smaller than a size of said attaching member.

2. The controller assembly according to claim 1, wherein in a plan view, a size of said coupling plate is smaller than a size of said main body part of said first controller main body, in a direction from said first side face toward said second side face.

3. A work machine cab comprising:
    the controller assembly according to claim 1; and
    a base plate supporting said attaching member of said controller assembly.

4. The work machine cab according to claim 3, wherein a through hole is formed in said base plate, and
    said attaching member has a support member supported on a top face of said base plate, a hanging part extending from said support member through said through hole of said base plate to a lower side of said base plate, and a bottom face part connected to a lower end of said hanging part, and
    said first controller main body is arranged above said bottom face part.

5. The work machine cab according to claim 3, further comprising:
    a second controller main body arranged next to said first controller main body;
    an air conditioning unit;
    a duct connected to said air conditioning unit and having a portion arranged below said controller assembly; and
    a fuse box, wherein
    in a plan view, said duct is arranged so as to overlap with said controller assembly, and
    said fuse box is arranged above and behind said second controller main body.

* * * * *